United States Patent
Adachi et al.

(10) Patent No.: US 7,957,544 B2
(45) Date of Patent: Jun. 7, 2011

(54) AUDIO SIGNAL OUTPUT CONTROL DEVICE THAT SUPPRESSES POP SOUND

(75) Inventors: Kazuki Adachi, Kyoto (JP); Tetsuro Sugioka, Kyoto (JP); Kiyomi Kimura, Nara (JP)

(73) Assignee: Panasonic Corporation, Osaka (JP)

( * ) Notice: Subject to any disclaimer, the term of this patent is extended or adjusted under 35 U.S.C. 154(b) by 1247 days.

(21) Appl. No.: 11/593,650

(22) Filed: Nov. 7, 2006

(65) Prior Publication Data

US 2007/0121962 A1    May 31, 2007

(30) Foreign Application Priority Data

Nov. 7, 2005  (JP) .................................. 2005-321977
Oct. 24, 2006 (JP) .................................. 2006-289099

(51) Int. Cl.
*H04B 15/00* (2006.01)
(52) U.S. Cl. .......... 381/94.5; 381/120; 381/123; 330/10
(58) Field of Classification Search ................. 381/94.5, 381/123, 94.1, 94.6, 94.7, 94.8, 120, 55, 381/59; 330/10, 251, 207 A, 51; 700/94
See application file for complete search history.

(56) References Cited

U.S. PATENT DOCUMENTS

| | | | | |
|---|---|---|---|---|
| 6,720,825 | B2* | 4/2004 | Hansen et al. ................... | 330/10 |
| 7,142,048 | B2* | 11/2006 | Miyagaki et al. ............... | 330/10 |
| 7,279,965 | B2* | 10/2007 | Hansen et al. ................... | 330/10 |
| 7,312,654 | B2* | 12/2007 | Roeckner et al. ............... | 330/10 |
| 7,417,504 | B2* | 8/2008 | Strydom et al. ............... | 330/251 |
| 2003/0058040 | A1* | 3/2003 | Miyagaki et al. ............... | 330/10 |
| 2005/0246163 | A1 | 11/2005 | Ono et al. | |

FOREIGN PATENT DOCUMENTS

JP   2001-223536 A   8/2001

\* cited by examiner

*Primary Examiner* — Vivian Chin
*Assistant Examiner* — Jason R Kurr
(74) *Attorney, Agent, or Firm* — McDermott Will & Emery LLP

(57) ABSTRACT

The potential of a smoothing capacitor for a speaker is smoothly changed by controlling the potential with use of a PWM signal and switching between outputting the PWM signal and an actual audio signal, thereby suppressing a pop sound. The scale of circuitry is reduced and cost is lowered by implementing a PWM circuit in a one-chip microcontroller. Noise is eliminated by outputting a pulse that has been divided in the PWM signal generation stage.

4 Claims, 10 Drawing Sheets

FIG. 8A   DIVISION NUMBER: 2

|  |  | REMAINDER | |
|---|---|---|---|
|  |  | 0 | 1 |
| PWM COUNTER | 0 | 0 | 1 |
|  | 1 | 0 | 0 |

FIG. 8B   DIVISION NUMBER: 4

|  |  | REMAINDER | | | |
|---|---|---|---|---|---|
|  |  | 0 | 1 | 2 | 3 |
| PWM COUNTER | 0 | 0 | 0 | 0 | 0 |
|  | 1 | 0 | 1 | 1 | 1 |
|  | 2 | 0 | 0 | 0 | 1 |
|  | 3 | 0 | 0 | 1 | 1 |

MAINBOARD OF TALKING APPLIANCE

AUDIO SIGNAL OUTPUT CONTROL DEVICE THAT SUPPRESSES POP SOUND

BACKGROUND OF INVENTION

1. Field of the Invention

The present invention relates to technology for controlling the output of an audio signal.

2. Related Art

In recent years, the development of "talking appliances" has been underway in the home appliance industry, and the aforementioned technology for controlling the output of an audio signal plays an important role in the development of such products. A "talking appliance" refers to a household electronic device that has the functions of announcing operational content by audio and responding to user operations by audio. Technology for controlling the output of an audio signal refers to technology for converting audio data pre-stored in ROM (Read Only Memory) to analog signals, and outputting the analog signals to a speaker. A conventional control apparatus is structured as a large-scale integrated one-chip microcontroller, and is generally implemented in the aforementioned household electronic devices along with a speaker.

In household electronic devices, there are provided a smoothing capacitor and a LC circuit cluster that constitutes a so-called filter for the speaker, and the control apparatus outputs audio signals to the speaker via the LC circuit cluster and the smoothing capacitor.

One example of a prior art for realizing high quality sound when outputting such audio signals is described in the following patent document.

Patent document 1: Japanese Patent Application Publication No. 2001-223536

SUMMARY OF INVENTION

However, given that the audio signal to be played back represents the audio for playback by a waveform whose reference potential is the midpoint potential of the smoothing capacitor, it is necessary to raise the potential of the smoothing capacitor to the reference potential when performing audio playback. On the other hand, since the internal units of the control apparatus are kept at high impedance when not playing back audio, charges rapidly flow into the smoothing capacitor when raising the potential of the smoothing capacitor to the reference potential. Such a rapid rise in the potential of the smoothing capacitor and the relaxation process for relaxation from the overshot potential to the reference potential are causes for a pop sound produced by the speaker. This type of pop sound differs in nature from the audio signals to be played back, and can be unpleasant to a user. Also, if the volume is too high, the pop sound may damage the speaker or create quality issues. In particular, speakers such as those used in "talking appliances" are often inexpensive, and it is possible for them to easily break by a pop sound at high volume. For reasons such as those above, it is necessary to prevent the occurrence of pop sounds.

In general, in order to prevent the occurrence of a pop sound, it is possible to insert a mute circuit for forcibly blocking or grounding the path of the audio signal until the output of the amplifier etc. reaches a stable steady-state. It is also possible to apply the technology described in the aforementioned patent document 1. Patent document 1 discloses a digital audio amplifier circuit for preventing a pop sound by electrically charging an output capacitor disposed between an amplifier etc. and a speaker with use of PWM (Pulse Width Modulation) waveform duties modulated from audio data, and by including fixed resistors disposed between the output and the power supply line and between the output and the ground so as to be connected only when the power is activated by a switch, thereby gradually changing the current flowing into the smoothing capacitor and smoothly changing the potential of the signal output to the speaker.

However, it is necessary to provide a mute circuit or fixed resistors when applying the above-described technology. When taking into consideration the large-scale integration of the aforementioned control apparatus, it is desirable to constitute the control apparatus using only logic elements and to integrate the control apparatus with the PWM circuit. Since the pop sound prevention according to patent document 1 requires that fixed resistors and a mute circuit composed of analog devices be disposed around the output capacitor, the control apparatus cannot be constituted from logic elements, and it is difficult to integrate the control apparatus with the PWM circuit to perform large-scale integration. The pop sound prevention of patent document 1 is therefore not a sensible countermeasure for pop sounds.

An aim of the present invention is to provide a control apparatus for realizing high-quality audio by eliminating rapid potential fluctuations in a smoothing capacitor without hindering large-scale integration.

In order to solve the above problems, an audio signal output apparatus of the present invention is a control apparatus for playing back audio by outputting an audio signal to a speaker, the control apparatus including: a generation unit operable to, before output of the audio signal, generate a pulse signal composed of a plurality of pulses, and output the generated pulse signal to a smoothing capacitor for the speaker; and a switch unit operable to switch between the audio signal and the pulse signal, wherein a duty ratio of each of the pulses is smaller the earlier the pulse exists on a time axis, and is larger the later the pulse exists on the time axis.

According to the control apparatus of the present invention having the structure described above, when a pulse is applied to the smoothing capacitor, the potential of the smoothing capacitor rises to a level corresponding to the duty ratio of the pulse. As such, if the duty ratio of the pulse is gradually increased, such as from 1/32 to 2/32, then 3/32, and so on to 16/32, the potential of the smoothing capacitor can be raised to a desired reference potential without a rapid change in potential, and therefore without causing an overshoot.

Given that, in this way, the potential of the smoothing capacitor can be changed without causing a rapid fluctuation thereof, the production of a pop sound is avoided, and the beginning of the audio playback is clean. This therefore makes it possible to leave the user with a good impression and further raise the quality of the household electronic device.

Also, the generation of pulses with different duty ratios can be realized by a PWM circuit for outputting an audio signal, a counter and the like, which is not a hindrance to large-scale integration. The manner in which the potential changes can be adjusted by changing parameters set in the PWM circuit, thereby making it possible to easily change settings according the properties of the external circuitry. Therefore, the cost of manufacturing the control apparatus is lowered, and the popularization of "talking appliances" with high quality sound can be further promoted.

Here, the generation unit may include a counter operable to perform count processing according to a reference clock of the control apparatus, and a PWM circuit operable to generate each of the pulses by modulating a width of the pulse in accordance with a digital value output by the counter.

The PWM circuit modulates the width of the pulses according to the digital values of the counter, thereby making it possible during designing to adjust the reference potential of the smoothing capacitor by setting the counter.

Here, the audio signal may represent audio to be played back, by a waveform whose reference potential is a midpoint potential of the smoothing capacitor, and the duty ratio of a last pulse among the plurality of pulses may have been set to a value corresponding to the reference potential.

Since the duty ratio of the last pulse in the PWM signal corresponds to the reference potential, it is possible to know from the digital value of the counter that the potential of the smoothing capacitor has reached the reference potential, even without detecting the potential, thereby enabling efficient control of the potential.

Here, the control apparatus may further include: a dividing unit operable to divide the digital value in each count cycle of the counter into a plurality of values, and output each of the values obtained by the dividing to the PWM circuit, wherein each of the pulses in the pulse signal may have a duty ratio in accordance with a different one of the values obtained by the dividing in the count cycle of the counter.

Dividing the digital values output by the counter and determining the duty ratios of the PWM signal based on the post-division digital values enables ensuring uniform periods during which the smoothing capacitor is charged in the count cycle, thereby realizing the stabilization of sound quality.

Here, when the digital value cannot be evenly divided by a predetermined number, the dividing unit may unevenly divide the digital value and selectively output values obtained by the uneven division to the PWM circuit.

Unevenly dividing the digital values output by the counter, and determining the duty ratios of the PWM signal based on the post-uneven-division digital values enables making the periods during which the smoothing capacitor is charged in the count cycle the same, even if the digital values cannot be divided by the division number evenly, thereby realizing the stabilization of sound quality.

Here, when at least a value m and a value n, being mutually different values, are obtained by the uneven division, the dividing unit may adjust a timing according to which each of the values m and n is output to the PWM circuit.

When the digital values are divided unevenly, adjusting the timing according to which the post-division digital values are output to the PWM circuit such that pulses with the same duty ratio are output successively as least often as possible enables the smoothing of fluctuations in the potential of the smoothing capacitor in the count cycle.

BRIEF DESCRIPTION OF DRAWINGS

These and other objects, advantages, and features of the invention will become apparent from the following description thereof taken in conjunction with the accompanying drawings, which illustrate specific embodiments of the present invention.

In the drawings.

DETAILED DESCRIPTION OF PREFERRED EMBODIMENTS

Embodiment 1

Structure

Figure 1:
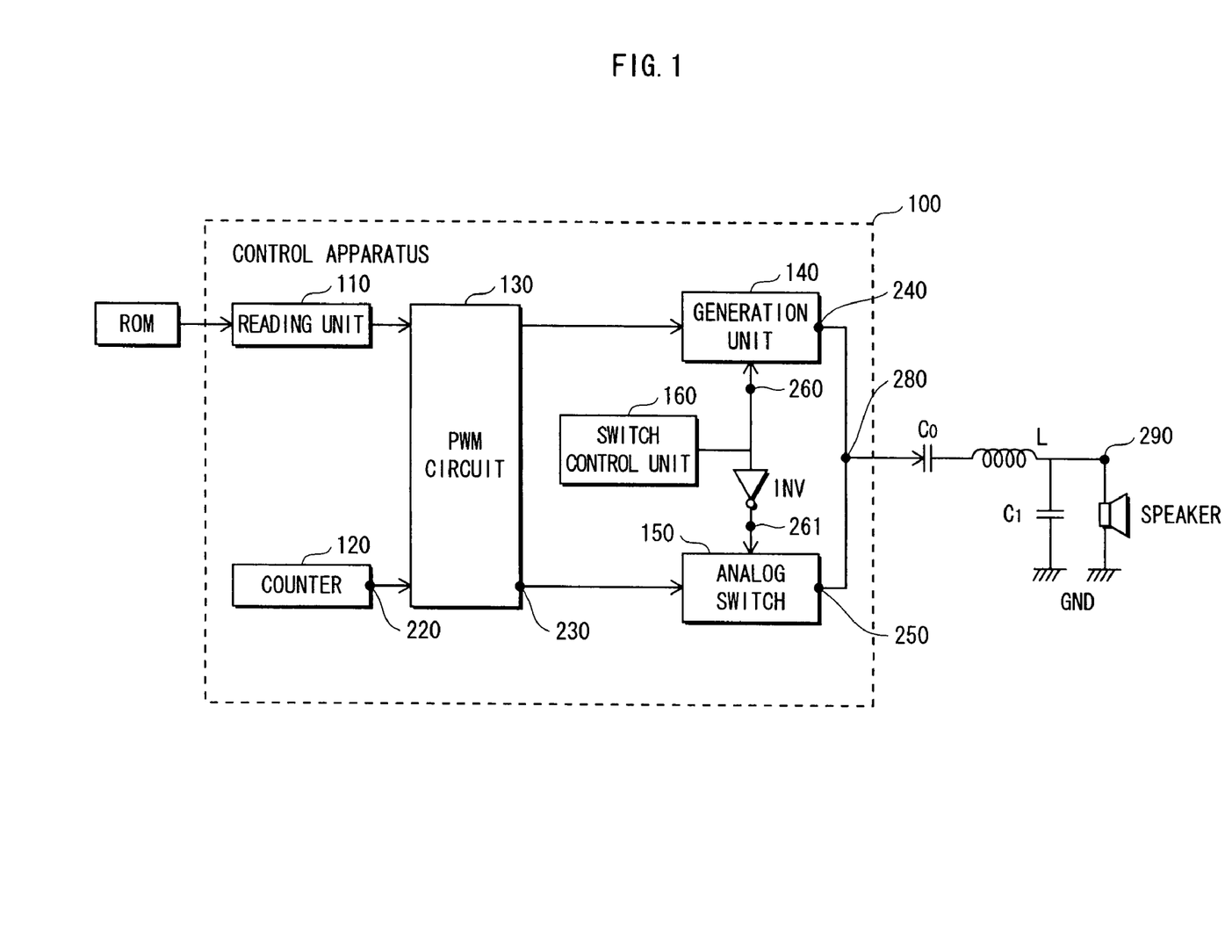
FIG. 1 shows a structure of a control apparatus in embodiment 1 of the present invention.

FIG. 1 shows a structure of a "talking appliance" and a control apparatus 100 in embodiment 1 of the present invention. The "talking appliance" in FIG. 1 has a structure in which audio data stored on a ROM is output as an audio signal by the control apparatus 100 corresponding to the portion enclosed in the dashed line, after which the audio signal passes through a smoothing capacitor C0 for performing smoothing and a noise filter composed of a coil L and a capacitor C1, and is output as audio from the speaker.

The control apparatus 100 in FIG. 1 includes a reading unit 110, a counter 120, a PWM circuit 130, a generation unit 140, an analog switch 150, and a switch control unit 160.

Figure 2:
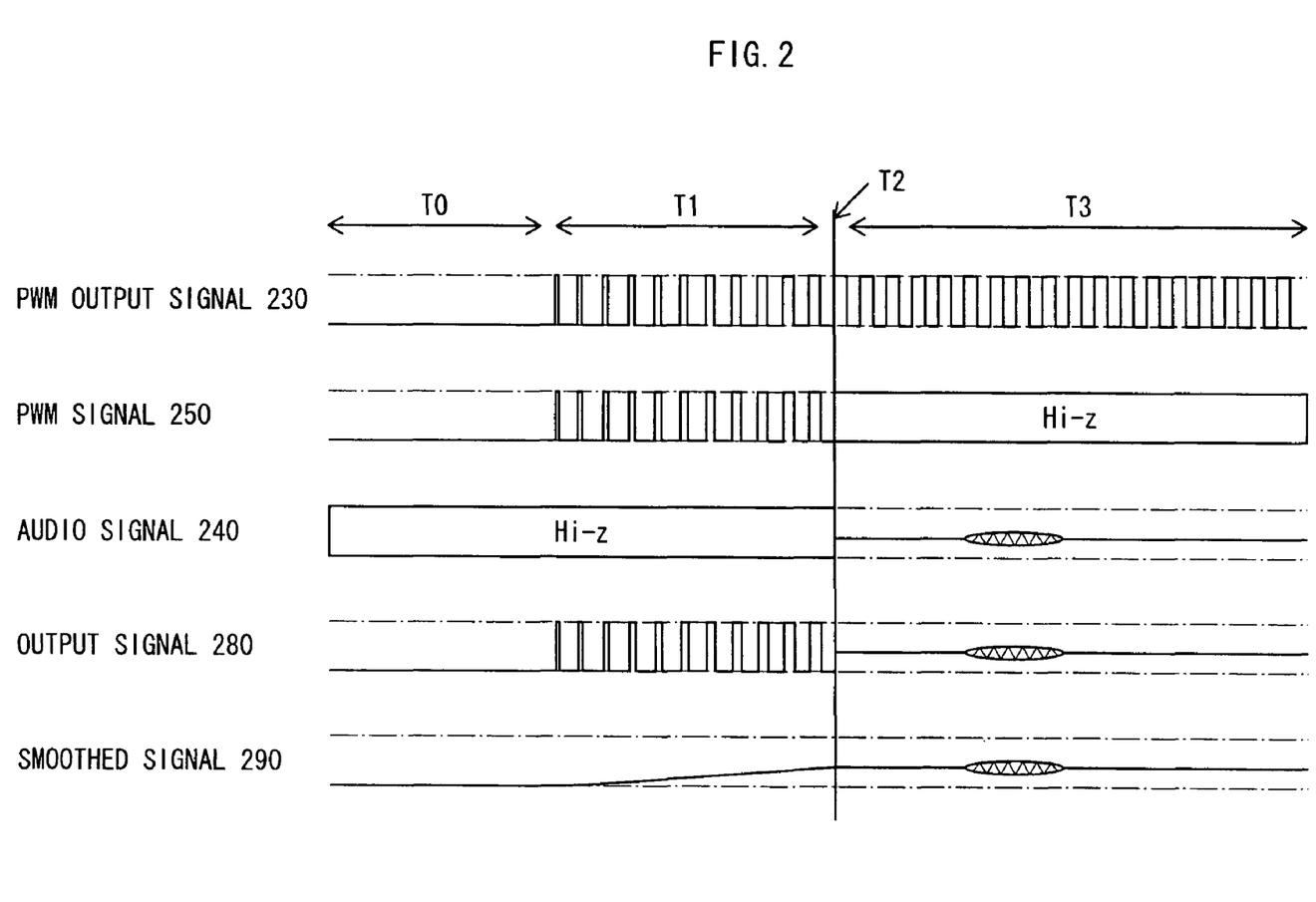
FIG. 2 is a timing chart in embodiment 1 of the present invention.

FIG. 2 shows the condition of the signal at points in FIG. 1 until the potential of the smoothing capacitor C0 when the power is activated enters the steady-state, and audio is played back. In FIG. 2, the time-area of the signals is divided into three periods, which are an initial period T0 before activation of the power, a transition period T1 during which the potential of the smoothing capacitor C0 gradually rises from when the power is activated, and a steady period T3 after the potential of the smoothing capacitor has reached the reference potential. Also, the point at which the transition period T1 is switched to the steady period T3 is a switch timing T2. The following describes details of the units with reference to FIG. 2.

The reading unit 110 reads audio data stored on the ROM, outputs digital values for generating a PWM waveform from the read audio data, and inputs the digital values to the PWM circuit 130.

The counter 120 outputs digital values that rise from 0 to 1, then to 2, and so on to n, such that when the power is activated, the pulse width of the PWM waveform gradually becomes wider, and the potential gradually rises from ground level to the reference potential. The counter 120 inputs the digital values to the PWM circuit 130. Here, the digital value n is a positive integer, and when the digital value is n, the output potential of the control apparatus 100 is considered to have reached the reference potential.

The PWM circuit 130 outputs a PWM signal having duty ratios determined based on the digital values input from the reading unit 110 or the counter 120. The PWM circuit 130 outputs a PWM audio signal to the generation unit 140 if the input is from the reading unit 110, and outputs a PWM output signal 230 to the analog switch 150 if the input is from the counter 120. As shown in the first tier of FIG. 2 for example, the PWM output signal 230 is a signal for causing duty ratios to rise by gradually making the width of pulses wider in the transition period T1, has a duty ratio of 1/2 at the switch timing T2, and causes the potential of the smoothing capacitor C0 to rise to the reference potential.

Figure 3:
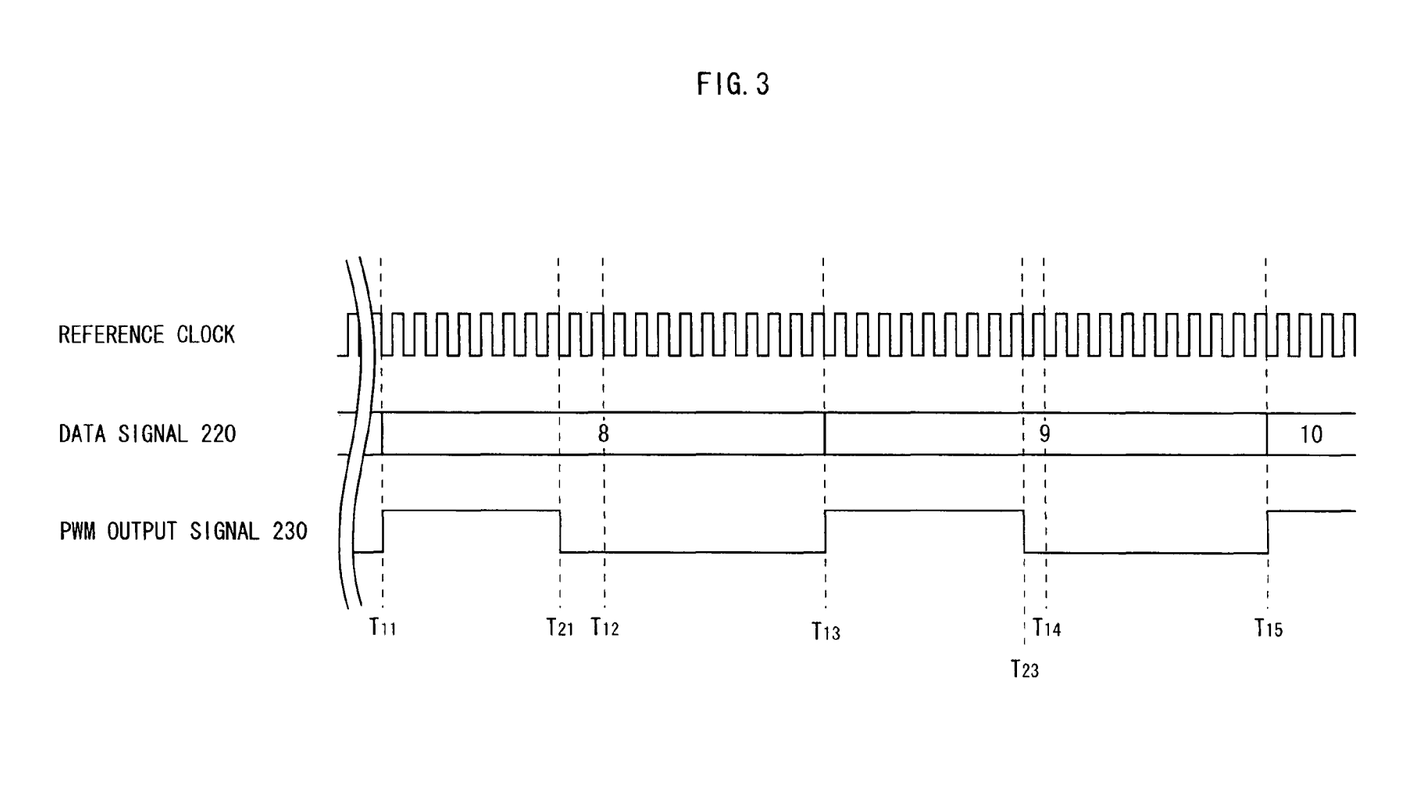
FIG. 3 illustrates a relationship between digital values and duty ratios in embodiment 1 of the present invention.

Next is a description of a method by which the PWM circuit 130 determines the duty ratios of the pulses based on the digital values, with reference to FIG. 3. A reference clock in FIG. 3 is a clock that drives the PWM circuit 130. A data signal 220 stores digital values, where one cycle is 20 cycles of the reference clock. As shown in FIG. 3, start points, end points, and an intermediate point of digital values 8, 9, and 10 in the digital signal 220 are called T11 to T15. The PWM circuit 130 is "H" at the start point of a digital value, and "L" after counting a number of reference clocks equal to the digital value. For example, the PWM circuit 130 is "H" at point T11 since the digital value 8 begins there, and is "L" at point T21 at which eight cycles of the reference clock have been counted. Next, the PWM circuit 130 is "H" at point T13 since the digital value 9 begins there, and is "L" at point T23 since nine cycles of the reference clock have been counted. In this way, pulses with a duty ratio of 8/20 and 9/20 are output.

When a switch control signal 260 from the switch control unit 160 is "H", the power supply of the generation unit 140 is turned on, and the generation unit 140 converts the PWM audio signal output by the PWM circuit 130 to an analog signal, and outputs the analog signal. When the switch control signal 260 from the switch control unit 160 is "L", the power supply of the generation unit 140 is turned off, and the generation unit 140 enters a floating Hi-Z state. An audio signal 240 output from the generation unit 140 is, for example, as shown in the third tier of FIG. 2, a signal in the floating Hi-Z state before the switch timing T2, and is output as an audio signal after the switch timing T2.

When a switch control inverted signal 261, which is inverted output from the switch control unit 160, is "H", the power supply of the analog switch 150 is turned on, and the analog switch 150 outputs, as is, the PWM output signal 230 output by the PWM circuit 130. When the switch control inverted signal 261 is "L", the power supply of the analog switch 150 is turned off, and the analog switch 150 enters the floating Hi-Z state. A PWM signal 250 output from the analog switch 150 is, for example, as shown in the second tier of FIG. 2, a pulse-modulated signal before the switch timing T2, and a signal in the floating Hi-Z state after the switch timing T2.

The switch control unit 160 is a switch for controlling the switching of an output signal 280 output by the control apparatus 100. The switch control unit 160 outputs the switch control signal 260 to the generation unit 140. The switch control unit 160 also outputs, to the analog switch 150 via an inverter circuit, the switch control inverted signal 261, which is the switch control signal 260 whose polarity has been inverted.

The control apparatus 100 outputs, as the output signal 280, a signal generated by shorting the audio signal 240, which is the output of the generation unit 140, and the PWM signal 250, which is the output of the analog switch 150. The output signal 280 is, for example, as shown in the fourth tier of FIG. 2, a pulse-modulated signal before the switch timing T2, and is output as an audio signal after the switch timing T2.

The output signal 280 output from the control apparatus 100 is smoothed by the smoothing capacitor C0, and a resulting smoothed signal 290 is input to the speaker via a general noise filter that uses the capacitor C1 and coil L. As shown in the fifth tier of FIG. 2 for example, the potential of the smoothed signal 290 gradually rises to the reference potential before the switch timing T2, and the smoothed signal 290 is output as an audio signal after the switch timing T2.

Operations

The following describes operations performed in the control apparatus 100 of embodiment 1 of the present invention, which has the structure described above. These operations are a countermeasure for a pop sound when playing back audio.

The following includes a description of the rising transition of the output potential of the smoothing capacitor C0 from ground level when the power is activated until reaching the reference potential. A falling transition from the reference potential to ground level is not described, due to being within the range of the following description.

Initial Period T0

First is a description of signal conditions in the initial period T0 before the power is activated.

In the initial period T0, the counter 120 outputs the digital value 0. In response to the digital value 0, the PWM circuit 130 does not output a pulse, and the PWM output signal 230 is maintained at ground level. The switch control unit 160 is set such that in the initial period T0, the switch control signal 260 is "L", and accordingly, the switch control inverted signal 261 is "H". Since the generation unit 140 is in the powered off state when the switch control signal 260 is "L", output is blocked, and the audio signal 240 is in the floating Hi-Z status. Since the analog switch 150 is in the powered on state when the switch control inverted signal 261 is "H", the PWM output signal 230 is output, as is, as the PWM signal 250. The control apparatus 100 therefore outputs the PWM signal 250 as the output signal 280. Since the output signal 280 is maintained at ground level, the smoothed signal 290 resulting from smoothing by the smoothing capacitor C0 is also maintained at ground level.

Transition Period T1

Next is a description of the transition period T1 in which the duty ratio of the PWM output signal 230 gradually increases, and the output potential rises to the reference potential.

In the transition period T1, the counter 120 successively increases from 0 to n, and the output potential rises up to the reference potential. As the digital value counted by the counter 120 increases, the PWM circuit 130 outputs the PWM output signal 230 with a gradually increasing duty ratio, as shown in FIG. 2. In the transition period T1, the switch control unit 160 maintains the settings in the initial period T0. In other words, since the switch control signal 260 is "L", and the switch control inverted signal 261 is "H", the audio signal 240 is in the floating Hi-Z state, and PWM output signal 230 is output, as is, as the PWM signal 250. The control apparatus 100 therefore outputs the PWM signal 250 as the output signal 280. Since the duty ratio of the output signal 280 increases gradually, the smoothed signal 290 smoothed by the smoothing capacitor C0 smoothly rises from ground level to the reference potential.

Figure 4:
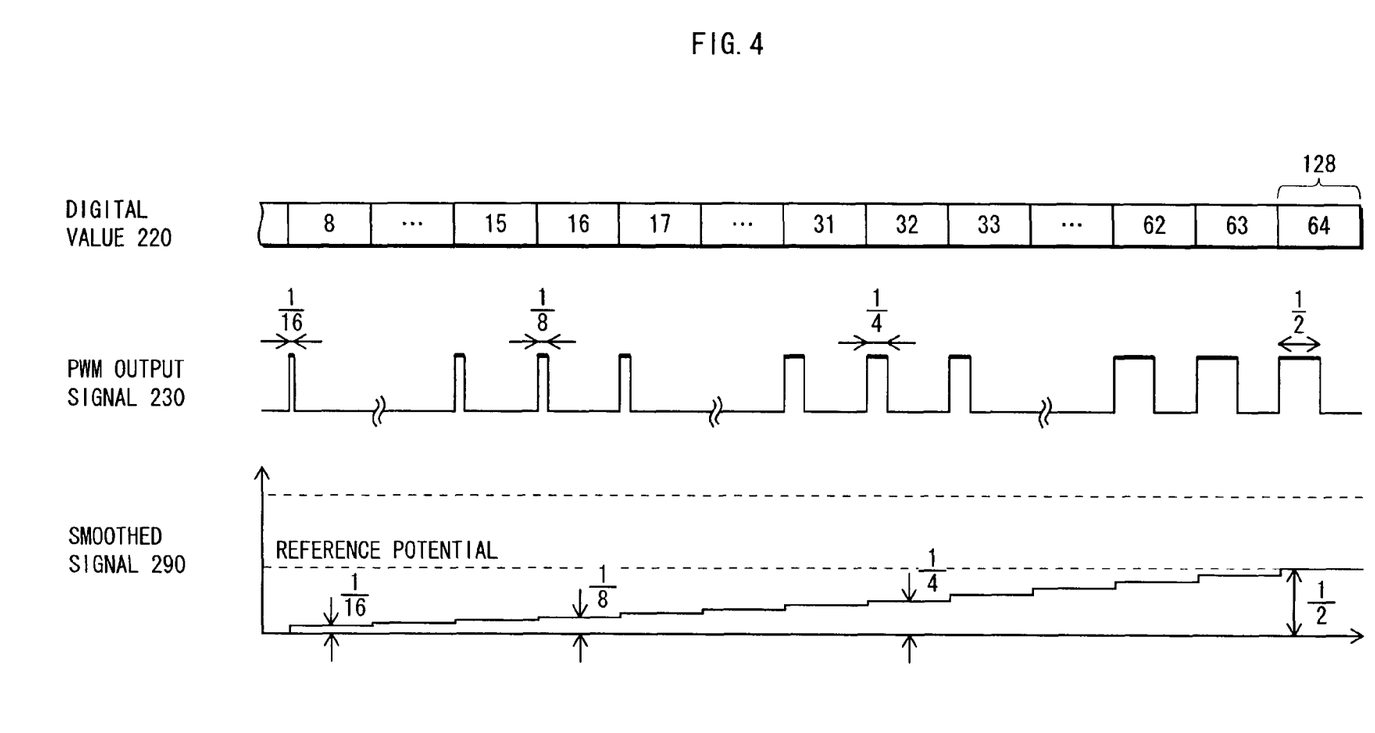
FIG. 4 illustrates a relationship between a PWM signal and a smoothing signal in embodiment 1 of the present invention.

The following is a description of operations from determining the duty ratio using the digital value until smoothing the output PWM signal 250, with reference to FIG. 4. Here, the digital values are considered to be stored for each 128 cycles of the reference clock in the PWM circuit 130. As shown in FIG. 4, when the counter 120 counts up to the digital value 64, which corresponds to half of 128 cycles of the reference clock, the duty ratio of the PWM output signal 230 is progressively increased by 1/128 from 0 until reaching 1/2, and the potential of the smoothed signal 190 rises in a step shape up to 1/2 of the pulse height. The amount that the potential rises in each count is slight as long as the number of reference clock cycles included in each of the digital values is sufficiently large, thereby enabling causing the potential of the smoothing capacitor C0 to rise smoothly.

Switch Timing T2

Next is a description of the switch timing T2 at which the switch control unit 160 performs switching.

In the transition period T1, the potential of the output signal 280 reaches the reference potential when the digital value reaches n. In this state, the switch control signal 260 is switched from "L" to "H". Accordingly, the switch control inverted signal 261 is switched from "H" to "L". Since the generation unit 140 is powered on when the switch control signal 260 is "H", the silent reference potential is output as the audio signal 240. Since the analog switch 150 is powered off when the switch control inverted signal 261 is "L", output of the analog switch 150 is blocked, and the PWM signal 250 is in the floating Hi-Z state.

In this way, the output signal 280 output by the control apparatus 100 is smoothly transitioned from the PWM signal 250 for raising the potential of the smoothing capacitor C0 to the reference potential, to the audio signal 240 for the actual output of audio.

Steady Period T3

In the steady period T3 following the switch timing T2, the audio signal 240, which is the analog signal output by the generation unit 140, is output from the control apparatus 100 as the output signal 280. The output signal 280 is smoothed by the smoothing capacitor C0, and the smoothed signal 290 is input to the speaker.

In this way, according to embodiment 1 of the present invention, the rise of the output signal from ground level when the power is activated to the reference potential is easily controlled by the duty ratios of the PWM signal 250, and the gradient and rising time can be set arbitrarily. Since control of the potential can be performed in a large-scale integrated one-chip microcontroller, an increase in chip area is prevented, and both cost and power consumption can be reduced.

Embodiment 2

In the control apparatus of embodiment 1, it is necessary for the duty ratios to be set with a high degree of accuracy in order to smoothly raise the output signal 280 from ground level to the reference potential using the PWM output signal 230. To this end, it is necessary to have a large number of reference clock cycles included in one cycle of the PWM output signal 230. Since the reference clock of the PWM circuit 130 cannot be changed easily, increasing the number of reference clock cycles requires the cycle of the PWM output signal 230 to be made longer. However, the potential of the PWM signal rises and falls with each pulse, thereby causing fluctuations in a signal synchronized with the PWM cycle. Noise is generated when the cycle of the PWM output signal 230 is lengthened and the frequency of the fluctuations enters the audible range.

Therefore, in embodiment 2 of the present invention, each pulse of the PWM output signal 230 is divided into two or more pulses in order to make the PWM cycle shorter and reduce the duty ratios of the pulses, thereby reducing fluctuations in the potential and eliminating noise.

Figure 5:
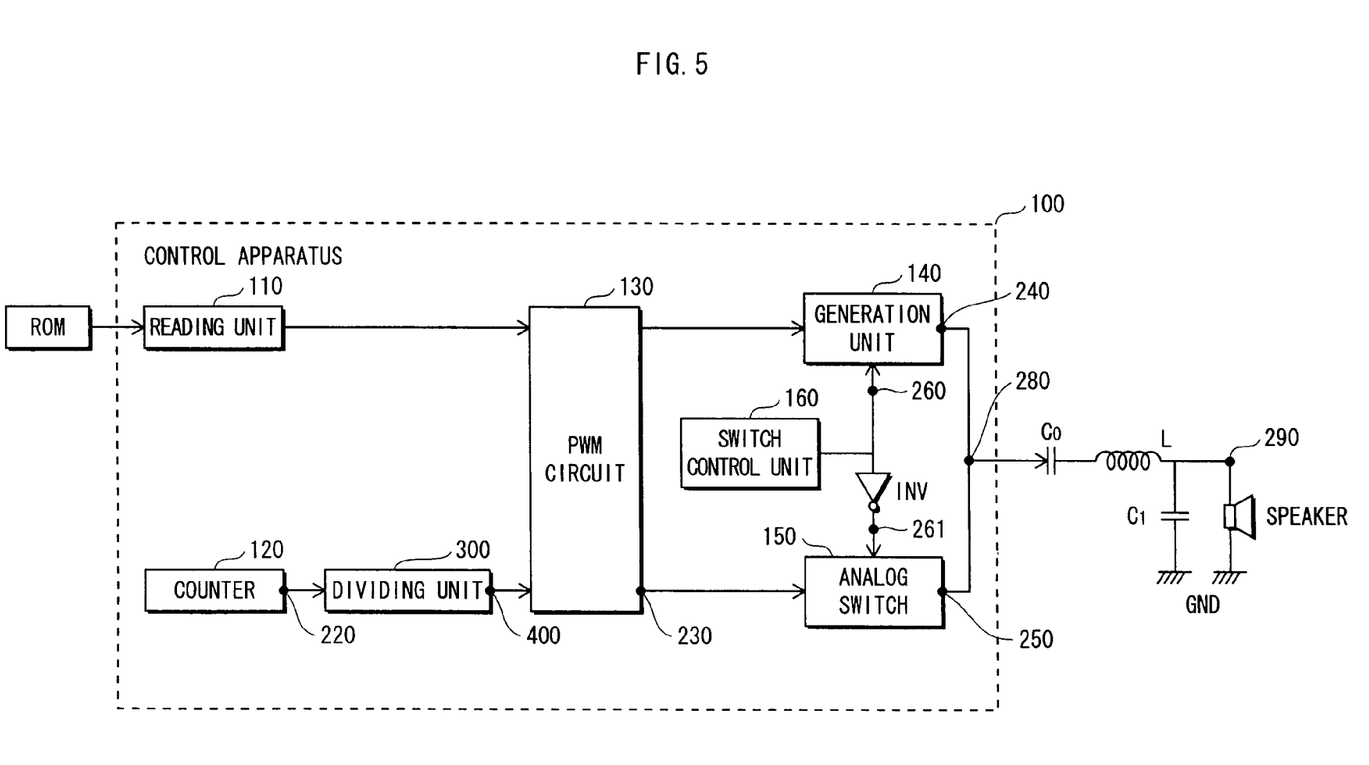
FIG. 5 shows a structure of a control apparatus in embodiment 2 of the present invention.

FIG. 5 shows a structure of a control apparatus 100 in embodiment 2 of the present invention. The control apparatus 100 includes a dividing unit 300 between the counter 120 and the PWM circuit 130 in FIG. 1.

Figure 6:
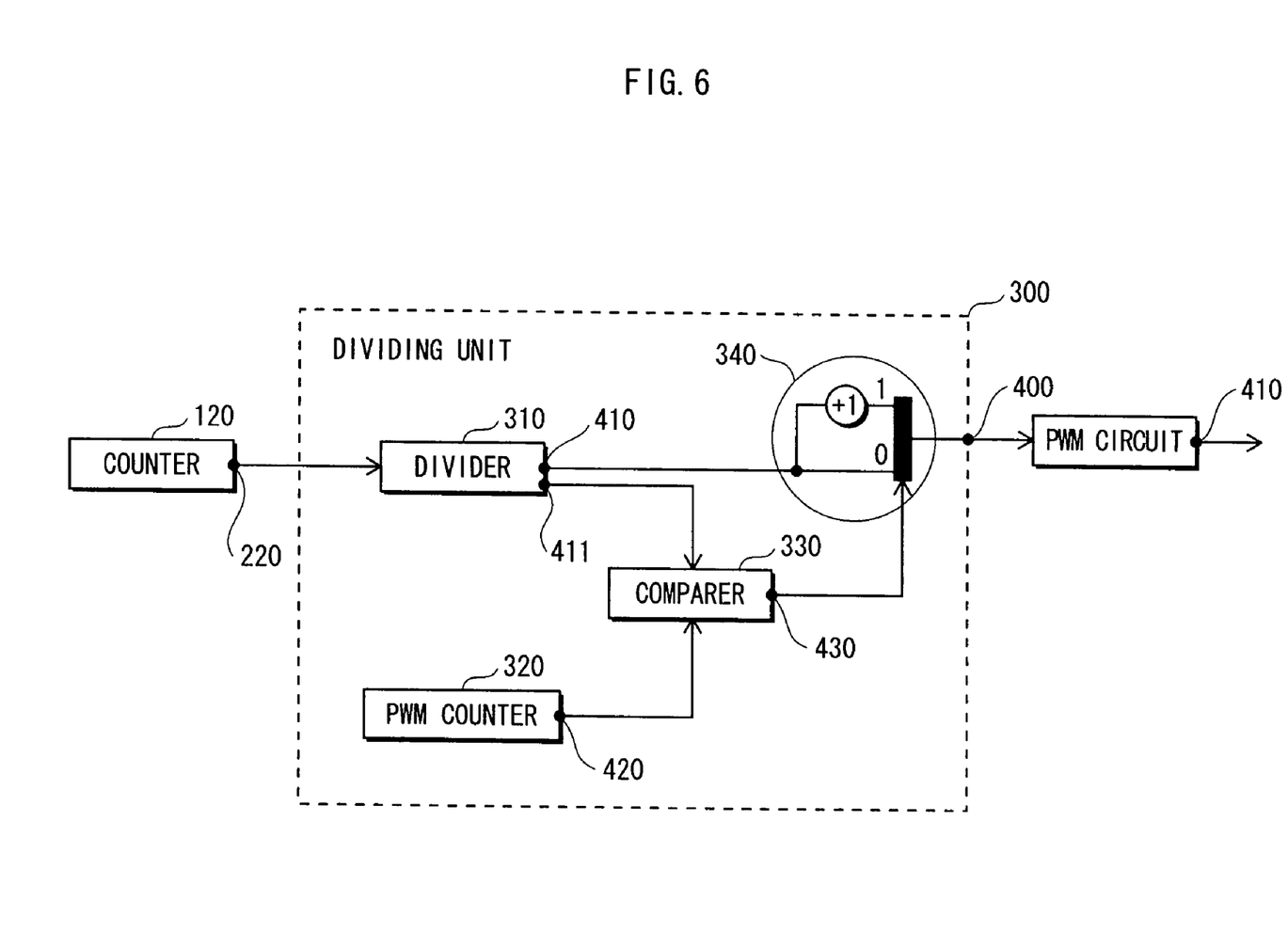
FIG. 6 shows a structure of a dividing unit in embodiment 2 of the present invention.

As shown in FIG. 6, the dividing unit 300 includes a divider 310, a comparer 330, a PWM counter 320, and an addition unit 340. The dividing unit 300 outputs digital values obtained by dividing a digital value counted by the counter 120 by a predetermined division number, and inputs the obtained digital values to the PWM circuit 130. The PWM circuit 130 outputs pulses with duty ratios that have been determined based on the digital values obtained by the division, similarly to embodiment 1.

Figure 7:
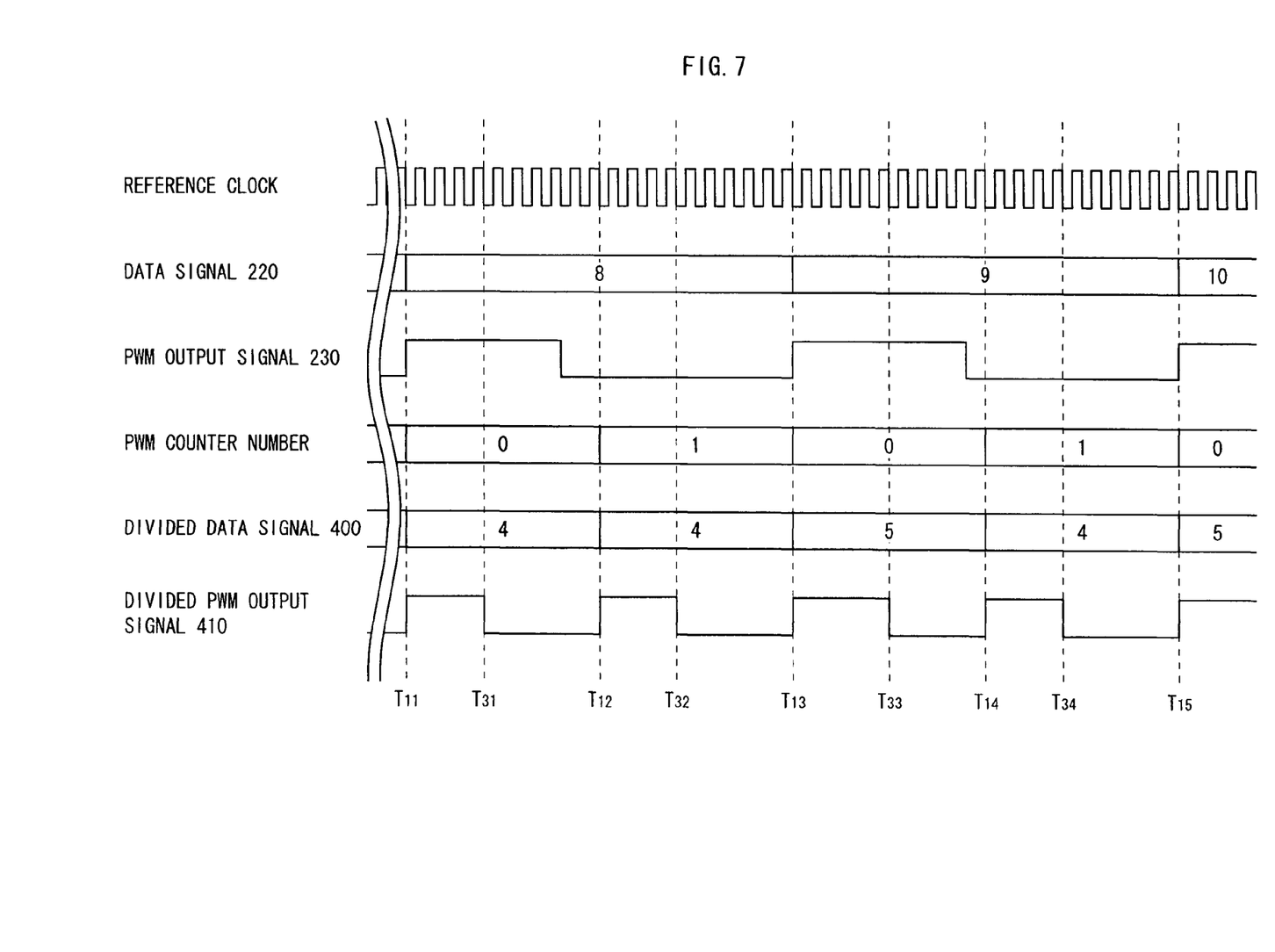
FIG. 7 illustrates a method for dividing a PWM signal in embodiment 2 of the present invention.

FIG. 7 illustrates a dividing method for the pulses in embodiment 2. In FIG. 7, the reference clock, the data signal 220 and the PWM output signal 230 are as described in embodiment 1, and noise countermeasures have not been performed on the signal. The following describes the structures of units in the dividing unit 300 with reference to FIG. 7.

The divider 310 divides a digital value by a division number, outputs a quotient 410 to the addition unit 340, and outputs a remainder 411 to the comparer 330. For example, since the division number in the example in FIG. 7 is 2, when the digital value is 8, the divider 310 outputs a quotient of 4 to the addition unit 340, and a remainder of 0 to the comparer 330. Also, when the digital value is 9, the divider 310 outputs a quotient of 4 to the addition unit 340, and a remainder of 1 to the comparer 330.

The PWM counter 320 is a counter for specifying what place a divided digital value falls in the order of divided segments of the original digital value, and is reset when the division number is counted up to. For example, since the division number is 2 in the example in FIG. 7, a PWM counter number 420 is reset to 0 after the PWM counter 320 has counted 0, then 1, and then 2.

Figure 8A:
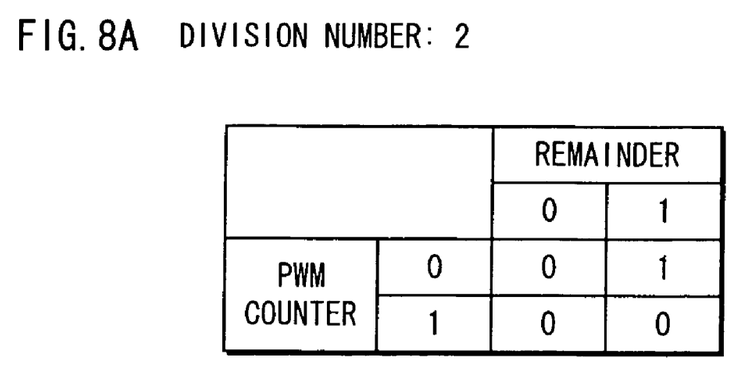
FIG. 8 is a remainder distribution table in embodiment 2 of the present invention.

The comparer 330 compares the remainder 411 output from the divider 310 and the PWM counter number 420, with a remainder distribution table predetermined for the division number. The comparer 330 outputs, to the addition unit 340, a comparison signal 430 for judging whether to allocate, to the digital values obtained by the division, the remainder obtained when the pre-division digital value cannot be evenly divided by the division number. The remainder distribution table is a table determining at what timings to output the quotient 410 and a value equaling the quotient 410 plus 1, as unevenly divided digital values when the pre-division digital value cannot be evenly divided by the division number. For example, since the division number is 2 in the example in FIG. 7, the comparer 330 performs a comparison with the remainder distribution table shown in FIG. 8A. When the pre-division digital value is 8, the remainder is 0. The value in the table is 0 when the PWM counter number 420 is both 0 and 1, and the output of the comparer 330 is therefore "L" in both cases. When the pre-division digital value is 9, the remainder is 1, and the comparer 330 outputs "H" when the PWM counter number 420 is 0, since the corresponding value in the table is 1 in this case, and outputs "L" when the PWM counter number 420 is 1, since the corresponding value in the table is 0 in this case.

When the pre-division digital value cannot be divided evenly by the division number, the addition unit 340 selects either the quotient 410 or a value equaling the quotient 410 plus 1 in accordance with the comparison signal 430 output by the comparer 330, and outputs the selected value to the PWM circuit 130. If the comparison signal 430 input from the comparer 330 is "H", the addition unit 340 adds 1 to the quotient 410 input from the divider 310, and outputs the resulting value. If the comparison signal 430 input from the comparer 330 is "L", the addition unit 340 outputs, as is, the quotient 410 input from the divider 310. For example, in the example in FIG. 7, the comparison signal 430 is "L" for all of the divided pulses when the pre-division digital value is 8, and in this case, the digital values obtained by the division equal a quotient of 4. On the other hand, when the pre-division digital value is 9, the obtained digital value for the first divided pulse is the quotient of 4+1=5 since the comparison signal 430 is "H" in this case, and the obtained digital value for the second divided pulse equals the quotient of 4 since the comparison signal 430 is "L" in this case.

Operations of the control apparatus 100 in embodiment 2 of the present invention are the same as those in embodiment 1, except for the digital values output by the counter 120 being divided by the dividing unit 300 before being input to the PWM circuit 130.

In the example in FIG. 7, since the pre-division data signal 220 is divided into the divided data signal 400, the PWM circuit 130 determines the start points and end points of the pulses as the positions T11 to T14 and T31 to T34 respectively.

Given that the digital values are divided by the dividing unit 300 before the operations of the PWM circuit 130, the PWM cycle of the generated PWM output signal 230 is shorter and fluctuations in the potential are smoother than in the case of the PWM output signal 230 being generated based on the pre-division digital values. This therefore enables the suppression of noise in the signal synchronized to the PWM cycle.

Figure 8B:
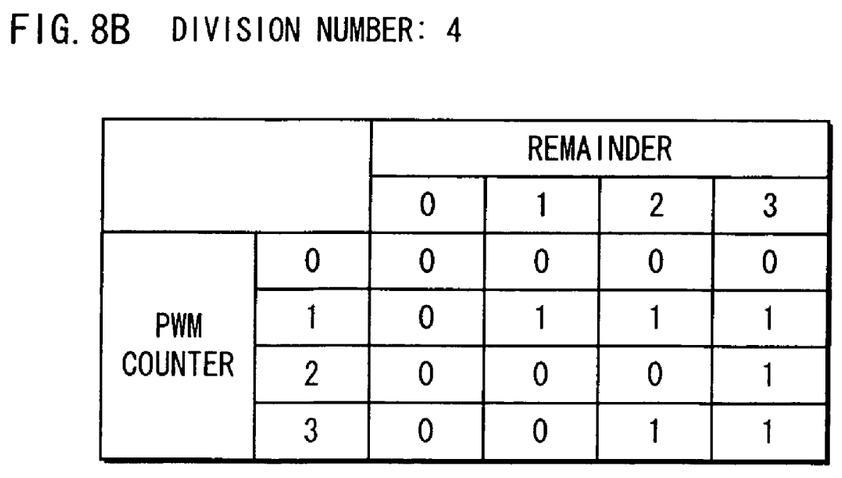

Note that although a case in which the division number is 2 is shown in the aforementioned example, cases in which the division number is 3 or more are the same except for changes in the remainder distribution table. For example, the remainder distribution table of FIG. 8B is used if the division number is 4. The remainder distribution tables are determined such that the remainder is distributed between the two or more obtained digital values with as least inequality as possible, such that fluctuations in the potential are few and smooth. Fluctuations in the potential can be further reduced the greater the division number is, thereby enabling more effective elimination of noise.

Other Embodiments

Implementation in a System LSI

Figure 9:
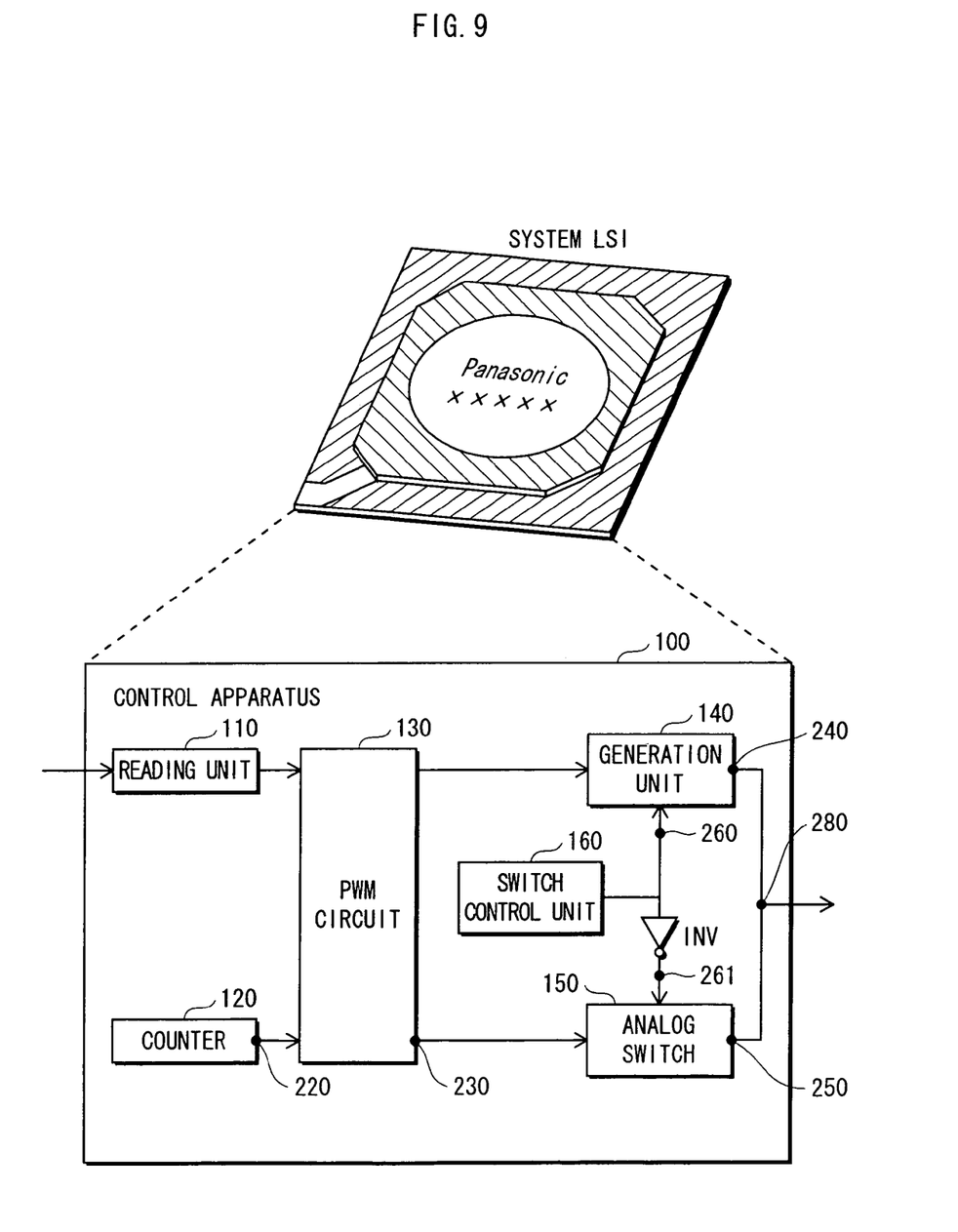
FIG. 9 illustrates a system LSI realizing the control apparatus in embodiment 1 of the present invention.

The control apparatus shown in FIG. 1 can be realized as a single system LSI, as shown in FIG. 9.

A system LSI refers to a package in which a bare chip has been mounted on a high density substrate. A system LSI also refers to a package in which two or more bare chips have been given the outward construction of a single LSI by mounting the bare chips on a high density substrate. This kind of system LSI is called a multi-chip module.

Focusing now on the types of packages, system LSIs include QFP (quad flat packages) and PGA (pin grid arrays). A QFP is a system LSI in which pins are attached to the four-sides of the package. A PGA is a system LSI in which a majority of the pins are attached to the bottom of the package.

These pins act as interfaces to other circuits. Given that the pins in a system LSI have this role as interfaces, the system LSI acts as the core of the "talking appliance" if other circuits are connected to these pins in the system LSI.

The following are details of specific production procedures. First, a circuit diagram of a portion to be the system LSI is created based on the structure diagram shown in each embodiment, and the constituent elements in the structure diagrams are realized using circuit elements, ICs and LSIs.

Buses connecting the circuit elements, ICs and LSIs, as well as interfaces with peripheral circuits and external devices are defined as the constituent elements are realized. Furthermore, connection lines, power lines, ground lines, clock signal lines and the like are defined. In these definitions, the operation timings of each constituent element are adjusted taking in account the specifications of the LSI, and other adjustments, such as ensuring the bandwidth necessary for each constituent element, are made as well. The circuit diagram is thus completed.

After the circuit diagram is completed, implementation designing is performed. Implementation designing refers to the creation of a substrate layout that determines where on the substrate to place the parts (circuit elements, ICs, LSIs) in a circuit diagram created by circuit designing, and how to wire connection lines in the circuit diagram on the substrate.

Here, the implementation designing includes automatic placing and automatic wiring.

When a CAD apparatus is used, automatic placing can be achieved with use of a dedicated algorithm called "centroid method". In the automatic wiring, connection lines that connect the pins of parts in the circuit diagram, are defined using metal foils and vias. When using a CAD apparatus, this wiring process can be achieved using dedicated algorithms called "maze method" and "line-search method".

Figure 10:
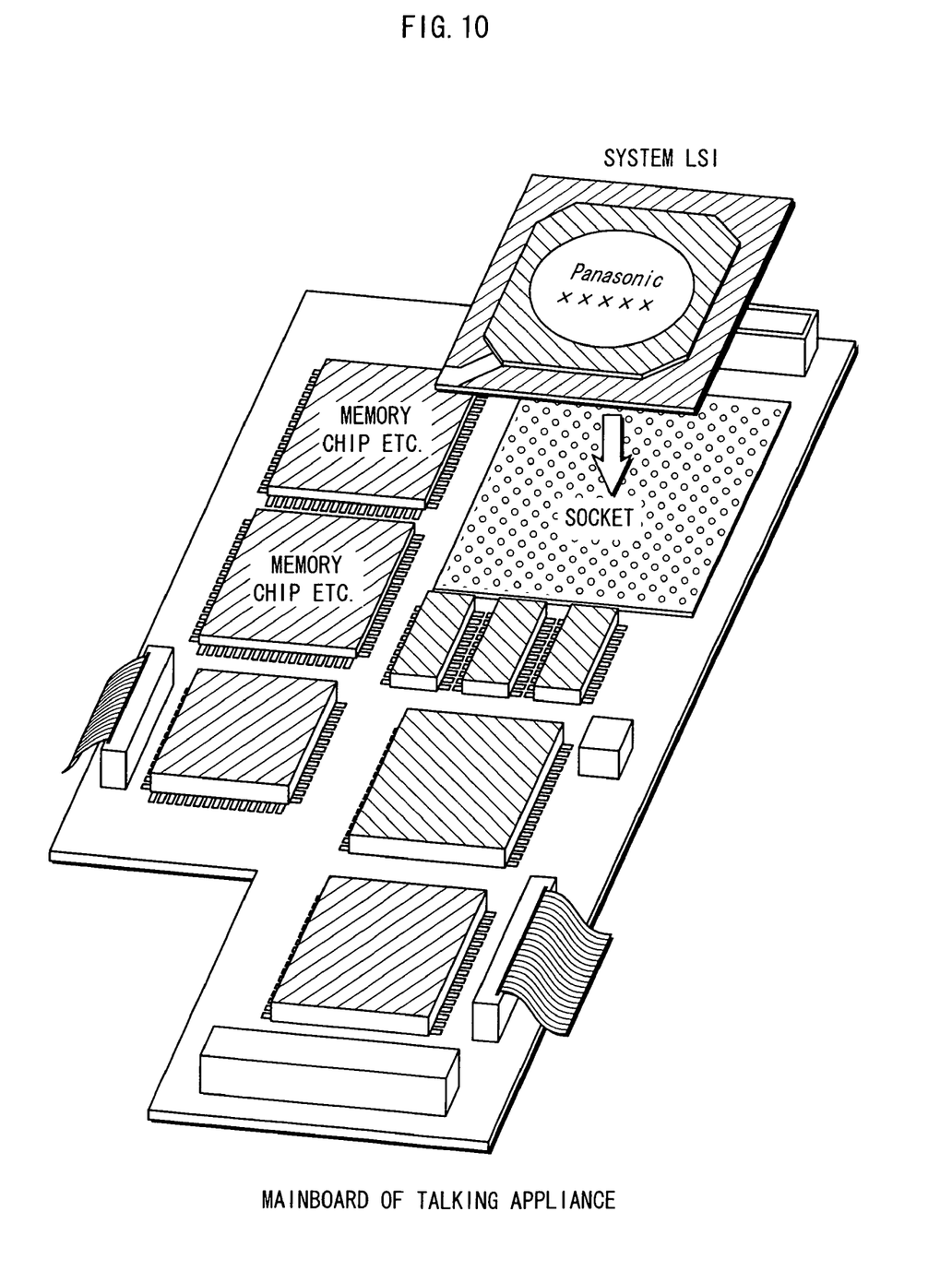
FIG. 10 illustrates a mainboard of a "talking appliance" incorporating the control apparatus in embodiment 1 of the present invention.

After the implementation designing is performed and the layout on the substrate is determined, the implementation designing results are converted into CAM data, and the CAM data is output to an NC machine tool etc. An NC machine tool performs SoC (System on Chip) implementation or SiP (System in Package) implementation based on the CAM data. SoC implementation a technique for fusing a plurality of circuits to a single chip. SiP implementation is a technique for using resin or the like to form a plurality of chips into a single package. Incorporating a system LSI formed this way, as shown in FIG. 10, enables the use of the control apparatus shown in the embodiments described above.

Note that an integrated circuit generated as described above may also be referred to as an IC, an LSI, a super LSI, or an ultra LSI, depending on the degree of integration.

Furthermore, all or some of the constituent elements of the control apparatuses may be constituted as a single chip. The integration is also not limited to SoC and SiP implementation, but instead may be realized by a dedicated circuit or a general-purpose process. After LSI manufacture, the use of a field programmable gate array (FPGA) or a silicon flexible processor in which the connection and settings of circuit cells in the LSI can be restructured is possible.

Furthermore, if integration technology is developed that replaces LSIs due to progressive or derivative semiconductor technology, integration of functional blocks using this technology is naturally possible. For example, the application of biotechnology is a possibility.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A control apparatus for playing back audio by outputting an audio signal to a speaker, the control apparatus comprising:
 a generation unit configured to, before output of the audio signal, generate a pulse signal composed of a plurality of pulses, and output the generated pulse signal to a smoothing capacitor for the speaker; and
 a switch unit configured to switch between the audio signal and the pulse signal, wherein a duty ratio of each of the pulses is smaller the earlier the pulse exists on a time axis, and is larger the later the pulse exists on the time axis, wherein the generation unit includes:
- a counter configured to perform count processing according to a reference clock of the control apparatus, and
- a PWM circuit configured to generate each of the pulses by modulating a width of the pulse in accordance with a digital value output by the counter, said control apparatus further comprising:
a dividing unit configured to divide the digital value in each count cycle of the counter into a plurality of values, and output each of the values obtained by the dividing to the PWM circuit,
wherein each of the pulses in the pulse signal has a duty ratio in accordance with a different one of the values obtained by the dividing in the count cycle of the counter.

2. The control apparatus of claim 1, wherein when the digital value cannot be evenly divided by a predetermined number, the dividing unit unevenly divides the digital value and selectively outputs values obtained by the uneven division to the PWM circuit.

3. The control apparatus of claim 2, wherein when at least a value m and a value n, being mutually different values, are obtained by the uneven division, the dividing unit adjusts a timing according to which each of the values m and n is output to the PWM circuit.

4. An integrated circuit for playing back audio by outputting an audio signal to a speaker, the integrated circuit comprising:
- a generation unit configured to, before output of the audio signal, generate a pulse signal composed of a plurality of pulses, and output the generated pulse signal to a smoothing capacitor for the speaker; and
- a switch unit configured to switch between the audio signal and the pulse signal, wherein a duty ratio of each of the pulses is smaller the earlier the pulse exists on a time axis, and is larger the later the pulse exists on the time axis, wherein the generation unit includes:
- a counter configured to perform count processing according to a reference clock of the integrated circuit, and
- a PWM circuit configured to generate each of the pulses by modulating a width of the pulse in accordance with a digital value output by the counter, said integrated circuit further comprising:
a dividing unit configured to divide the digital value in each count cycle of the counter into a plurality of values, and output each of the values obtained by the dividing to the PWM circuit,
wherein each of the pulses in the pulse signal has a duty ratio in accordance with a different one of the values obtained by the dividing in the count cycle of the counter.

* * * * *